(12) United States Patent
Merrill et al.

(10) Patent No.: US 6,894,278 B1
(45) Date of Patent: May 17, 2005

(54) ELECTRON RADIOGRAPHY

(75) Inventors: Frank E. Merrill, Los Alamos, NM (US); Christopher Morris, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/630,110

(22) Filed: Jul. 30, 2003

(51) Int. Cl.$^7$ .............................................. H01J 37/26
(52) U.S. Cl. .................................. 250/311; 250/396 R
(58) Field of Search .............................. 250/311, 396 R

(56) References Cited

U.S. PATENT DOCUMENTS 4,608,491 A * 8/1986 Kokubo .................... 250/311

* cited by examiner

*Primary Examiner*—Kiet T. Nguyen
(74) *Attorney, Agent, or Firm*—Milton D. Wyrick

(57) ABSTRACT

A system capable of performing radiography using a beam of electrons. Diffuser means receive a beam of electrons and diffuse the electrons before they enter first matching quadrupoles where the diffused electrons are focused prior to the diffused electrons entering an object. First imaging quadrupoles receive the focused diffused electrons after the focused diffused electrons have been scattered by the object for focusing the scattered electrons. Collimator means receive the scattered electrons and remove scattered electrons that have scattered to large angles. Second imaging quadrupoles receive the collimated scattered electrons and refocus the collimated scattered electrons and map the focused collimated scattered electrons to transverse locations on an image plane representative of the electrons' positions in the object.

6 Claims, 2 Drawing Sheets

FIG. 3A
FIG. 3B
FIG. 4A
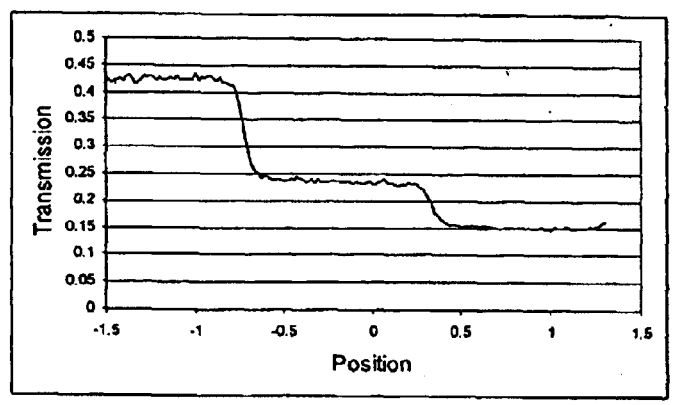
FIG. 4B

ELECTRON RADIOGRAPHY

The present invention generally relates to radiographic imaging systems, and, more specifically, to the use of electrons to produce radiographic images. This invention was made with Government support under Contract No. W-7405-ENG-36 awarded by the U.S. Department of Energy. The Government has certain rights in the invention.

BACKGROUND OF THE INVENTION

The imaging of objects is important in many current endeavors, including medical, pharmaceutical, and industrial investigations. Radiography, in general, is the process of producing images of opaque items by the penetration of radiation, such as gamma rays, x-rays, or charged particles, such as protons, electrons or muons. When a beam of such radiation is transmitted through a heterogeneous item, the radiation is differentially affected by its varying thickness, density and chemical composition. The radiation emerging from the items forms a radiographic image, which is formed on an image detection medium, such as onto a photographic film directly, or onto a phosphor to convert the radiation to visible light, which is then imaged.

As seen, radiography is a non-destructive method of imaging the internal features of objects. It often is used to non-destructively detect medical condition such as tuberculosis and bone fractures, and in manufacturing processes to detect defects such as voids, cracks, and porosities.

The use of high-energy protons to produce these radiographic images is a mature technology for many imaging applications. However, this type of proton radiography has several drawbacks. Among these are the reasonably low resolution of small density differences, a lack of ability to image thin objects, and the creation of a relatively high level of residual radiation in the imaged object.

The present invention solves these problems with conventional radiography by providing apparatus for the non-destructive imaging of objects using electrons as the charged particles. The electrons provide superior resolution and sensitivity in the imaging of thin objects.

SUMMARY OF THE INVENTION

In order to achieve the objects and purposes of the present invention, and in accordance with its objectives, an apparatus for performing electron radiography of an object comprises a source of electrons, with diffuser means receiving the electrons for diffusing said electrons. First matching quadrupoles receive the diffused electrons for focusing the diffused electrons prior to the diffused electrons entering the object placed in the path of the diffused electrons. First imaging quadrupoles receive the focused diffused electrons after the focused diffused electrons have been scattered by the object for focusing the scattered electrons. First collimator means receive the scattered electrons for removing electrons that have scattered to large angles, and second imaging quadrupoles receive the collimated scattered electrons for refocusing the collimated scattered electrons and mapping the focused collimated scattered electrons to transverse locations on an image plane representative of the electrons' positions in the object.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIGS. 3A and 3B are radiographs produced by use of the present invention.

FIGS. 4A and 4B are a radiograph produced by the use of the present invention of an aluminum step wedge, and a graph of transmission versus position for steps having a width of 1 cm and steps of 0.002, 0.004 and 0.006 inches, representing areal densities of 14–42 mg/Cm$^2$.

DETAILED DESCRIPTION

The present invention provides radiograph imaging utilizing high-energy electrons, allowing the invention to image extremely thin objects. The invention can be understood most easily through reference to the drawings.

Figure 1:
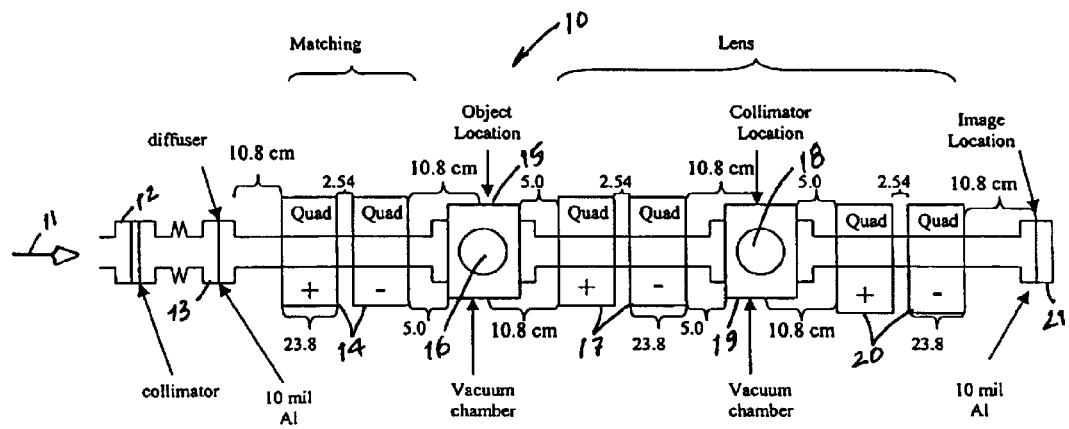
FIG. 1 is a schematic drawing of an embodiment of the present invention illustrating the components involved.

Referring first to FIG. 1, where a schematic illustration of electron radiography system 10 of the present invention is shown. A beam of electrons 11 from a source of electrons enters collimator 12 and passes to foil diffuser 13 where the beam is spread out as it progresses to matching quadrupoles 14. Matching quadrupoles 14 modify the path of beam of electrons 11 to focus the electrons prior to entering vacuum chamber 15, in which object 16 resides. Matching quadrupoles 14 operate to set up the proper characteristic for beam of electrons 11 for injection into object 16.

As beam of electrons 11 pass through object 16, their trajectories are scattered by Coulomb interactions with electrons in object 16. After exiting object 16, beam of electrons 11 is focused initially by Imaging quadrupoles 17. Beam of electrons 11 that have been scattered to a great extent are then removed by collimator 18 in vacuum chamber 19. The remaining electrons in beam of electrons 11 then pass through imaging quadrupoles 20, where they are focused before creating an image at image location 21. Imaging quadrupoles serve to reform the image of object 16 after contrast has been introduced by collimator 18.

The quantity of electrons of beam of electrons 11 not removed by collimator 18 at each position in the image provides information on the thickness of object 16 at that position. Thin sections of object 16 scatter fewer electrons into collimator 18 than thick sections of object 16. Therefore, the transmission fraction of electrons in beam of electrons 11 that pass completely through electron radiography system provide areal density information about object 16.

Beam of electrons 11 utilizes 20 MeV electrons that are very interactive. This greatly contributes to the ability of the present invention to detect very small variation in areal density of thin objects 16. Such electrons are readily available from medical electron and other sources.

Figure 2A:
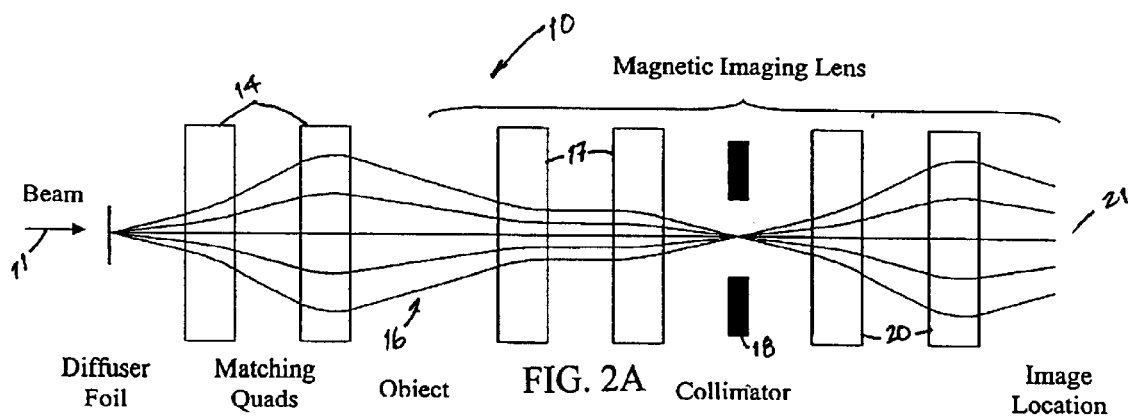
FIGS. 2A and 2B are illustrations of electron trajectories through the embodiment of the invention shown in FIG. 1 for the ideal electron trajectories and for the electron trajectories when scattered by passing through an object inserted into their paths, respectively.
Figure 2B:
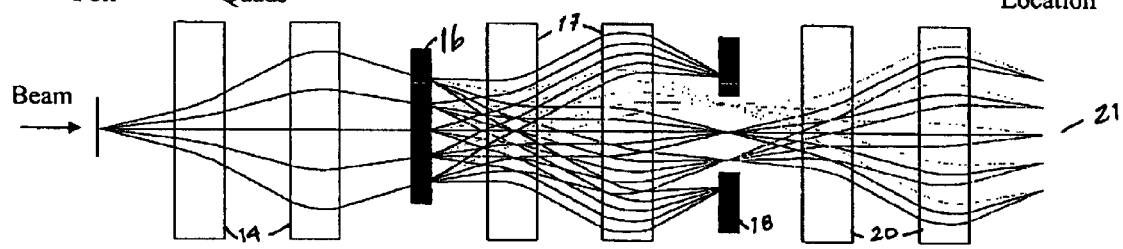

FIG. 2 illustrates the path of beam of electrons 11 as it passes through electron radiography system 10. At FIG. 2A, beam of electrons travel along their ideal trajectories because there is no object 16 to scatter the electrons. In FIG. 2B, an object 16 has been inserted into electron radiography system 10, causing the electrons to be scattered as they pass through object 16. FIG. 2B shows how electrons that are scattered to large angles are removed by collimator 18, and how electrons that pass through collimator 18 are re-formed to an image at image location 21.

Those having skill in this art will readily appreciate that imaging quadrupoles 17, 20 function to establish a one-to-one position map of electron beam 11 from its being scattered by object 16, to image location 21, thereby forming the image of object 16. At collimator 18, the radial position of electrons in electron beam 11 is proportional to the scattering angle imposed on the trajectory of electrons while traversing through object 16. Collimator 18 being located between imaging quadrupoles 17, 20, selectively removes the electrons that are scattered to large angles. This greatly contributes the image contrast achieved by the present invention.

As an example of the efficacy of the present invention, a $1/16^{th}$ inch thick Aluminum plate had the letters "LANL" machined through it. This plate was inserted into electron radiography system 10. The resulting radiograph is shown as a digital image in FIG. 3A. The resolution of this image is approximately 300 $\mu$m, as expected from prior predictions of the resolution.

In another test of the sensitivity of the present invention to accurately image thin systems, a "GOLD MARKER" PILOT® pen was used to write the letters "eRad" on a piece of paper. The ink in this pen contained 17% copper by weight, and resulted in a deposition of a <0.001 inch layer of copper on the paper. As seen in the digital image in FIG. 3B, the letters are completely readable.

To determine the usefulness of the present invention in imaging step type changes in objects, an aluminum step wedge was imaged. This particular step wedge had steps that were 1 cm wide and 0.002, 0.004, and 0.006 inch thick. The step wedge represents areal densities of 14–42 mg/cm$^3$. The radiograph is illustrated as a digital image in FIG. 4A, and clearly shows the individual steps of the step wedge. A plot of electron transmission versus position is illustrated in FIG. 4B for the radiograph of FIG. 4A. This plot graphically portrays the ability of the present invention to accurately image small differences in the density of an object.

All of these tests were conducted with 20 MeV electrons. As previously stated, such electrons are readily available from readily available sources, which are much more easily constructed than are proton sources.

Those skilled in this art also will appreciate that magnification could be introduced into the present invention to further improve its already excellent resolution. The optics of the present invention would be similar, but magnification would set up a 1-to-M mapping, where M is the magnification factor.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modification as are suited to the particular use contemplated. It is intended that the scope of the invention be defined by the claims appended hereto.

What is claimed is:

1. Apparatus for electron radiography of an object comprising:

a source of electrons;

diffuser means receiving said electrons for diffusing said electrons;

first matching quadrupoles receiving said diffused electrons for focusing said diffused electrons prior to said diffused electrons entering said object placed in the path of said diffused electrons;

first imaging quadrupoles receiving said focused diffused electrons after said focused diffused electrons have been scattered by said object for focusing said scattered electrons;

first collimator means receiving said scattered electrons for removing electrons that have scattered to large angles;

second imaging quadrupoles receiving said collimated scattered electrons for refocusing said collimated scattered electrons and mapping said focused collimated scattered electrons to transverse locations on an image plane representative of said electrons' positions in said object.

2. The apparatus as described in claim 1 wherein said source of electrons provides electrons having an energy of approximately 20 MeV.

3. The apparatus as described in claim 1 wherein said object is located in a vacuum chamber.

4. The apparatus as described in claim 1 wherein said first collimator is located in a vacuum chamber.

5. The apparatus as described in claim 1, further comprising a second collimator receiving said electrons and collimating said electrons before said electrons enter said diffuser means.

6. The apparatus as described in claim 1, further comprising magnification means for magnifying said mapping of said focused collimated scattered electrons.

* * * * *